US006452166B1

(12) United States Patent
Enke et al.

(10) Patent No.: US 6,452,166 B1
(45) Date of Patent: Sep. 17, 2002

(54) RESISTIVE STABILIZATION OF THE ELECTROSPRAY IONIZATION PROCESS

(75) Inventors: Christie G. Enke, Albuquerque, NM (US); George S. Jackson, Albuquerque, NM (US)

(73) Assignee: University of New Mexico, Albuquerque, NM (US)

( * ) Notice: Subject to any disclaimer, the term of this patent is extended or adjusted under 35 U.S.C. 154(b) by 0 days.

(21) Appl. No.: 09/552,646

(22) Filed: Apr. 19, 2000

(51) Int. Cl.[7] ................................ H01J 37/00

(52) U.S. Cl. ................................ 250/288; 250/423 R

(58) Field of Search ........................ 250/288, 423 R

(56) References Cited

U.S. PATENT DOCUMENTS 5,725,151 A * 3/1998 Hetrick et al. ................ 239/3
6,068,749 A * 5/2000 Karger et al. ............... 250/288

* cited by examiner

*Primary Examiner*—Kiet T. Nguyen
(74) *Attorney, Agent, or Firm*—Hoffman, Wasson & Gitler

(57) ABSTRACT

An electrical equivalent circuit is provided for an electrospray process. It is a series circuit which includes a power supply voltage ($V_{app}$), a voltage ($V_{ec}$) established at the electrochemical contact to the solution, a solution resistance ($R_s$), a constant current regulator which represents the processes of charge separation and charge transport in the gap between the spray needle aperture and the counter electrode, and a voltage ($V_{cn}$) caused by charge neutralization at the counter electrode. A current i, established by the constant current regulator flows throughout the entire circuit. Current-voltage curves are developed for each part of the circuit. From these it is shown that in the case where $R_s$ is negligible (the power supply is connected directly to a conducting needle) the shape of the current-voltage curve is dictated by the constant current regulator established by the charge separation process, the gap, and the counter electrode. The solution resistance is significant if a non-conducting needle is used so that the electrochemical contact to the solution is remote from the tip. The high series resistance acts to stabilize the operation of an electrospray ionization device enabling operation over a wider range of experimental conditions than without it. This occurs somewhat naturally in a narrow-bore glass capillary when the contact to the solution is several cm from the capillary tip. Stability can be achieved with a separate series resistor for glass needles with tip contact, metal-coated glass needles, wide-bore glass needles and metal needles.

10 Claims, 9 Drawing Sheets

RESISTIVE STABILIZATION OF THE ELECTROSPRAY IONIZATION PROCESS

BACKGROUND OF THE INVENTION

Electrospray ionization is an electrical phenomenon. To aid in the understanding of the electrical phenomena, an equivalent circuit is often drawn. In an equivalent circuit, electrical components of known properties are used to simulate the behavior of the actual circuit. In the equivalent circuit, one chooses components that have a current-voltage behavior similar to that of the individual elements in the actual circuit. In this paper, we have analyzed each of the elements in the electrospray circuit with respect to its current voltage curve so that an appropriate equivalent circuit can be drawn. The achievement of a useful equivalent circuit serves the purpose of separating the electrical effects of the various circuit elements so that they may be studied and understood individually. This is particularly advantageous in a system with so many interactive elements as electrospray ionization.

The accepted circuit diagram for the electrospray ionization process is shown in FIG. 1. The voltage from the power supply 3 is connected to a metal contact 4 through which the analyte solution flows. The metal contact 4 may be the metallic electrospray needle 5 itself, or a metallic union 6 that joins the needle 5 to the capillary tubing 7 that supplies the analyte. The connection between the metal and the analytical solution is essentially electrochemical. The analytical solution issues from the spray tip in the form of charged droplets 8. The droplets have the same charge sign as the pole of the power supply 3 that is connected to the electrochemical contact. The charged droplets 8 are attracted across an air gap 9 to the counter-electrode 10 where they are neutralized. The connection between the counter-electrode 10 and the other pole 11 of the power supply 3 completes the circuit. A small orifice 12 in the counter-electrode allows some of the ions from the solution to enter the vacuum chamber of the mass spectrometer (not shown) for mass analysis. The fraction of charge that enters the orifice is also neutralized eventually and that portion of the current returned to the power supply. All the elements and processes in the electrospray circuit are in series as shown so that the current that flows in this circuit is everywhere the same.

SUMMARY OF THE INVENTION

A circuit that separates the several processes of electrospray ionization is shown in FIG. 2. Most of the processes are shown as functional blocks rather than circuit components to identify the electrical nature of each step. The process in FIG. 2 can be related to the circuit elements in FIG. 1 as follows. The electrochemical contact 15 occurs between the metal to which the power supply is connected and the solution in that region of the metal/solution contact closest to the electrospray tip. If the connection is to a metallic union and a non-metallic glass capillary is used as the spray needle, there may be some solution resistance 16 between the electrochemical contact 15 and the spray tip. At the needle tip, charge separation 17 occurs as a result of the high electric field that exists between the tip and the counter-electrode. The charge separation 17 is in the formation of the charged droplets that emanate from the tip. The charged droplets are then attracted across the air gap 19 between the tip and the counter-electrode. All the charge that is separated at the tip is neutralized 20 at the counter-electrode or inside the mass spectrometer and returned to the power supply 21. Another characteristic of a series circuit is that the sum of voltage drops across all the process shown must equal the voltage applied by the power supply.

High series resistance acts to stabilize the operation of an electrospray ionization device enabling operation over a wider range of experimental conditions than without it. This occurs somewhat naturally in a narrow-bore glass capillary with remove contact. Stability can be achieved with a separate series resistor for glass needles with tip contact, wide-bore glass needles and for metal needles.

DETAILED DESCRIPTION OF THE INVENTION

Figure 1:
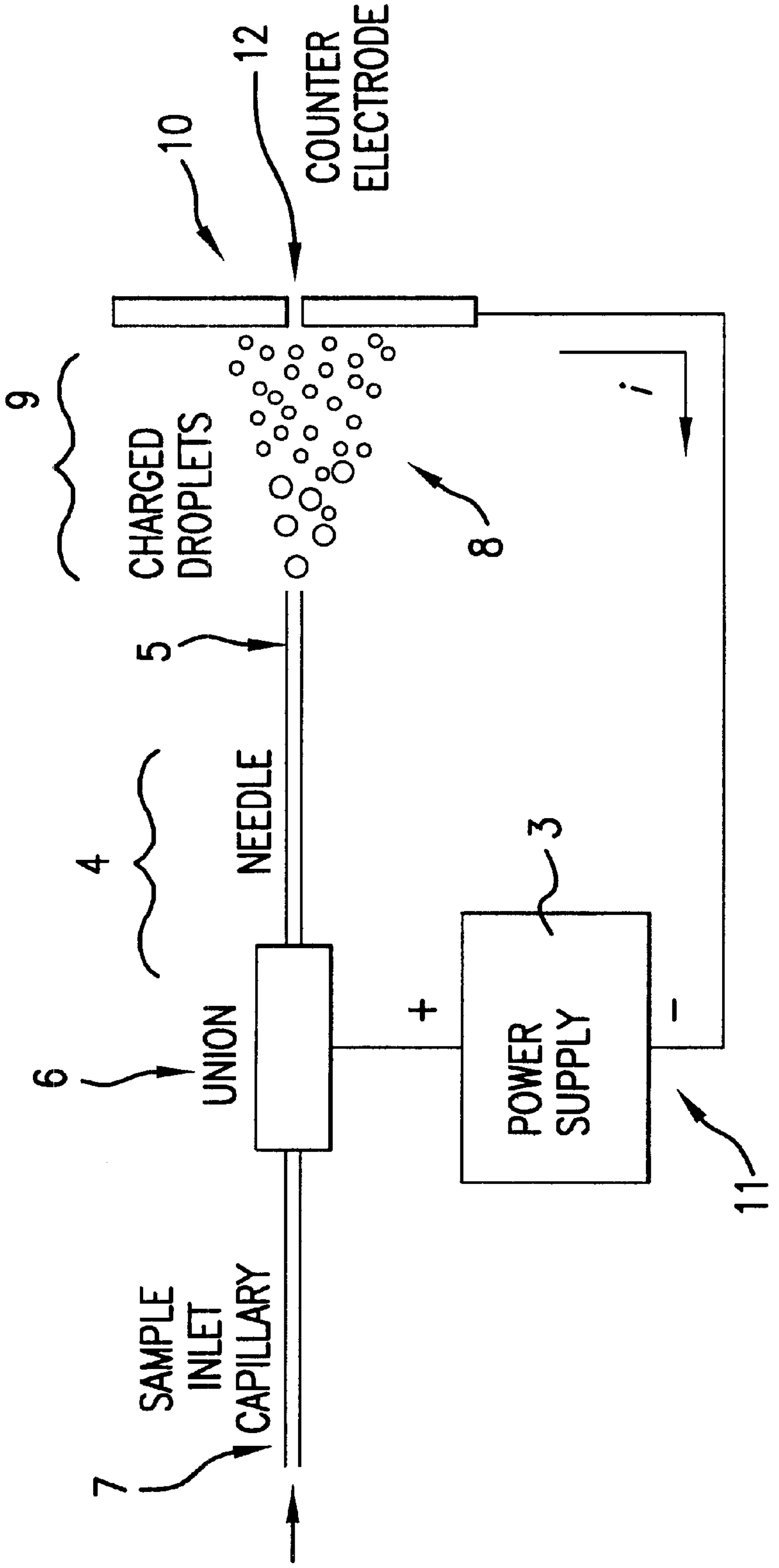
FIG. 1 (PRIOR ART)
FIG. 1 is a circuit diagram for an electrospray ionization process.
Figure 2:
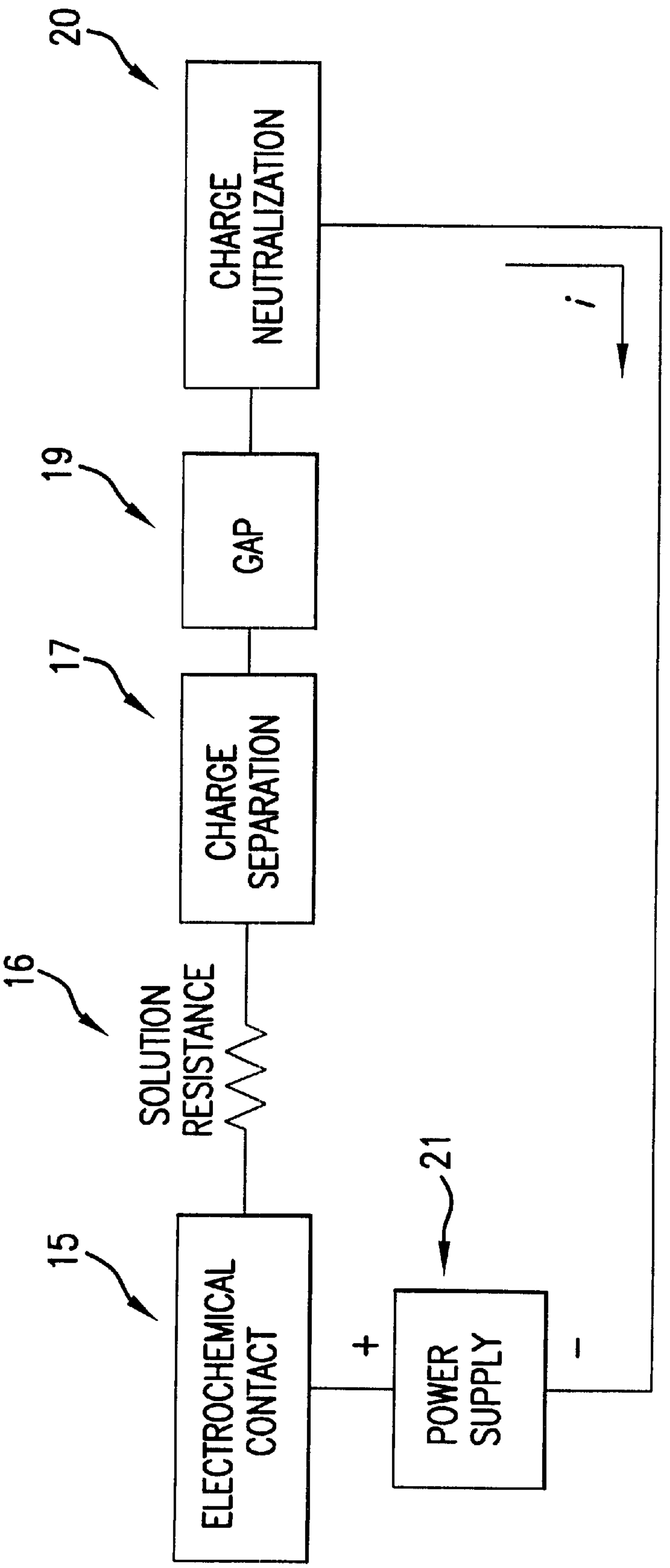
FIG. 2 is a circuit for electrospray ionization of the present invention in block form.
Figure 3A:
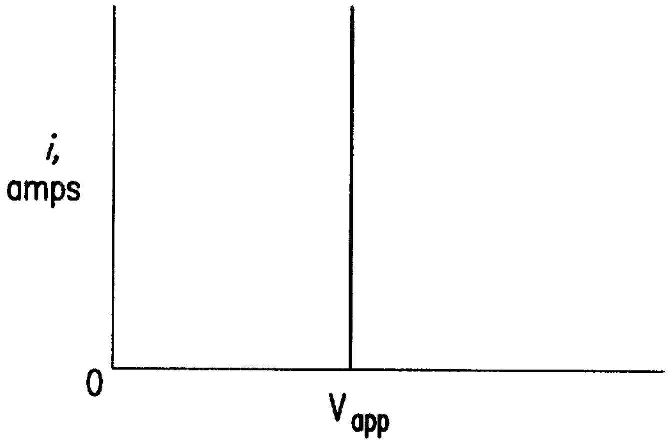
FIGS. 3(*a*), 3(*b*) and 3(*c*) are current-voltage curves for a) the current vs. the power supply voltage ($V_{app}$), b) the current vs. the electrochemical voltage ($V_{ec}$), and c) the current vs. $V_{device}$ for a current limited device.

The power supply of the invention is presumed to provide a constant voltage regardless of the current required of it (over the reasonable electrospray ionization operating range) The electrical equivalent of this is a battery of set voltage ($V_{app}$) with an internal resistance of 0 ohms. For this device, the plot of current vs. voltage would be a vertical line at $V_{app}$as shown in FIG. 3*a*. The internal resistance of the power supply is obtained from the differential definition of resistance, i.e., R=dV/di. Since the voltage does not change with the amount of current drawn, the resistive component of the power supply is zero. The other important point about the power supply is that its settings determines the total voltage, $V_{app}$, applied to the overall electrospray process. The individual voltages of all the individual electrospray ionization processes will sum to equal the voltage $V_{app}$.

Figure 3B:
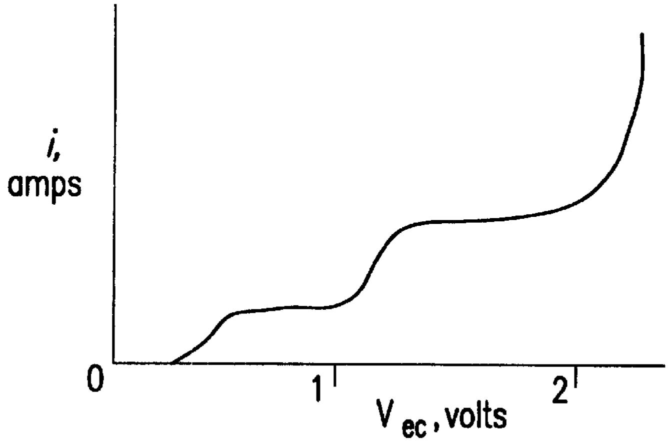

The electrospray process is likened to an electrochemical cell where the metal-solution contact is the anode (when making positive ions) and the counter-electrode where the charge neutralization occurs is the cathode. The current-voltage curves of electrochemical processes have been well characterized and applied to the contact process in electrospray ionization. The general nature of the electrochemical current-voltage curve is shown in FIG. 3*b*. The voltage corresponding to the first rise in current corresponds to the oxidation potential of the most easily oxidizable solution component. Further increases in voltage do not cause this reaction to go faster (increasing the current) when the reaction becomes limited by the rate of diffusion of the oxidizable species to the metal surface.

The second rise in current occurs at the oxidation potential of the second most readily oxidized solution component. The rate of its oxidation may also become diffusion limited. Eventually, if one increases the voltage or current high enough, one encounters the potential at which the solvent can become oxidized. This oxidation is not diffusion limited so the current can rise virtually without limit at this voltage.

The normal electrochemical current-voltage curve shown is for an electrode of fixed area and for which the charge transfer process is rapid relative to the rate of diffusion. In the case of electrospray ionization, the portion of the metal-solution contact area at which the oxidation is occurring may increase back from the area closest to the tip as the current increases. It is also possible that some charge transfer polarization could occur. The largest imaginable voltage involved in the electrochemical contact is a few volts while normal power supply voltages are in the thousands of volts.

Included in the actual current-voltage curve for the electrochemical contact is the resistance involved in transporting the excess counterions produced at the electrospray ionization tip back to the point of the electrochemical process. When metallic or metalized needles are used (or when the contact is made by a thin wire reaching almost to the tip) the iR drop across this resistance is at most a few volts. When significant, this resistance will cause some positive slope in the portions of the FIG. 3*b* current-voltage curve that are flat and it will increase the voltage $V_{ec}$ required to achieve a given current. If the electrochemical contact is located far from the tip of a non-conducting needle, the solution resistance can have a significant effect.

The equivalent circuit elements for the electrochemical contact are a voltage source (represented as a battery) and a series resistor. The former represents the voltage required by the electrochemical process for the value of the circuit current. From FIG. 3*b*, we can see that the value of this voltage increases in steps according to the circuit current. The polarity of the battery will always oppose that of the power supply. The series resistor is the resistance to the movement of the counterion charge from the tip of the needle to the site of the electrochemical oxidation.

There is a charge-separation step that occurs in the solution at the needle tip. The strong electric field across the gap draws positive ions in the solution to the exposed surface of the solution, similarly repelling a corresponding amount of anionic charge back from the surface. Droplets breaking off from the positively charged solution surface retain some of the excess positive charge. These positively charged droplets are now in the gap between the tip and the counter-electrode and charge separation has occurred. The same field that created the charge separation now attracts the droplets to the counter-electrode where they will be neutralized to complete the circuit. Because of the equality of the current everywhere in the circuit, the rate of formation of excess charge in the droplets is exactly equal to the rate of production of excess anionic charge in the solution which in turn is exactly equal to the required rate of the electrochemical reaction and the current supplied by the power supply.

Charge separation is a complex process dependent on the applied voltage, the solution composition, the distance of the tip from the counter-electrode, the flow rate of the solution and the diameter of the tip. Generally, the relationships involved in the electrospray ionization process are expressed in terms of the dependency of the circuit current on the other experimental parameters.

In normal electrospray, it is the rate of the charge separation process that determines the current that flows in the overall circuit and thus through every other component and process. By normal electrospray, we mean only the charge separation resulting from the electrostatic spray process and not from corona discharge or other processes resulting from the breakdown of the insulating properties of the air in the gap. Since the charge separation process controls the current in the circuit, the appropriate equivalent circuit element is a constant current regulator. This has the symbol of a circuit with an arrow indicating the direction of the current.

As discussed above, charged droplets produced by the charge separation process appear in the gap between the tip and the counter-electrode. Because of their charge and the presence of the high electric field in this region, the droplets are drawn toward the counter-electrode. While in the gap, the droplets are also undergoing evaporation of the solvent. Solvent evaporation cannot affect the total amount of charge produced by the charge separation process. The field strength required to induce the electrostatic spray process is certainly sufficient to attract and collect the entire charge produced by the charge separation process. The current in the gap is due to and controlled by the rate of charge separation at the needle tip. A change in the gap voltage does not change the fraction of the separated charge collected, since it is always unity.

Figure 3C:
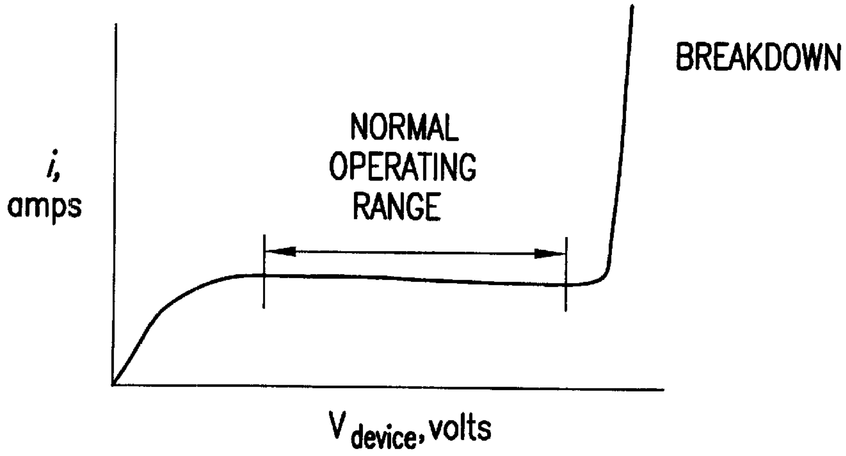

The process involved in the gap of the electrospray ionization system is analogous to that of the gap in a phototube, a photodiode or a flame ionization detector. In these devices, the process producing the charge separation is distinct from the collection of the separated charge. The photons striking the photocathode (or depletion region) create electrons (or electron-hole pairs) which then, due to the electric field in the device, are all collected by the electrode creating the field. The current in the external circuit is then equal to the rate of charge production and collection. In the case of the flame ionization detector, the ion/electron pairs formed by the flame from the analyte are all collected by the electrodes forming the charge collection field in the device. The current-voltage curves for these devices is of the type shown in FIG. 3*c*. There is a step shape at low applied voltage (collection field strength) where the field is not strong enough to collect all the separated charge before charge recombination can occur. Once a strong enough field has been applied, all the separated charge is collected and the current is limited by the rate of charge separation. The curve, in this region, is absolutely flat because, in the devices mentioned, the rate of charge separation is only a function of the photon flux or the rate of influx of analyte, not the field strength. At a high enough applied field strength, there may be a dielectric breakdown of the medium between the electrodes and a precipitous rise in the current. In this region, the device is no longer functioning for its intended purpose. This would correspond to the discharge region for electrospray ionization.

In the case of electrospray ionization, there is an opportunity for confusion because the current observed is not independent of the field strength in the gap. However, this dependency is due to the effect of the field strength on the rate of charge separation, not on the effectiveness of the field in collecting all the separated charge. Because the efficiency of charge collection is not a function of the applied field in the normal operating range, a resistive model is not appropriate for the gap. In a resistor, the flux of charge through the resistor is a function of the applied field. In the case of the gap conduction, this is not true. There is a voltage across the gap, but it is not due to an iR drop caused by the current across it. The voltage is due to the bias voltage applied across the non-conducting gap in order to collect all the charge carriers that have been induced in it. This bias voltage is necessary to allow the charge separation process to act as a constant current regulator in the circuit. Therefore, we will include it in the constant current symbol by noting the voltage across the tap by the symbol $V_{gap}$.

Ionic charge crossing the gap hits the counter electrode or enters the orifice to the mass spectrometer. This charge is neutralized by its encounter with metal that is connected to the negative pole of the power supply. The neutralization process for positive ions is an electrochemical reduction. In a manner analogous to the electrochemical contact, only a modest voltage is required for this process to proceed at the rate set by the charge separation. This voltage is symbolized by a battery with polarity opposite to that of the power supply.

Figure 4:
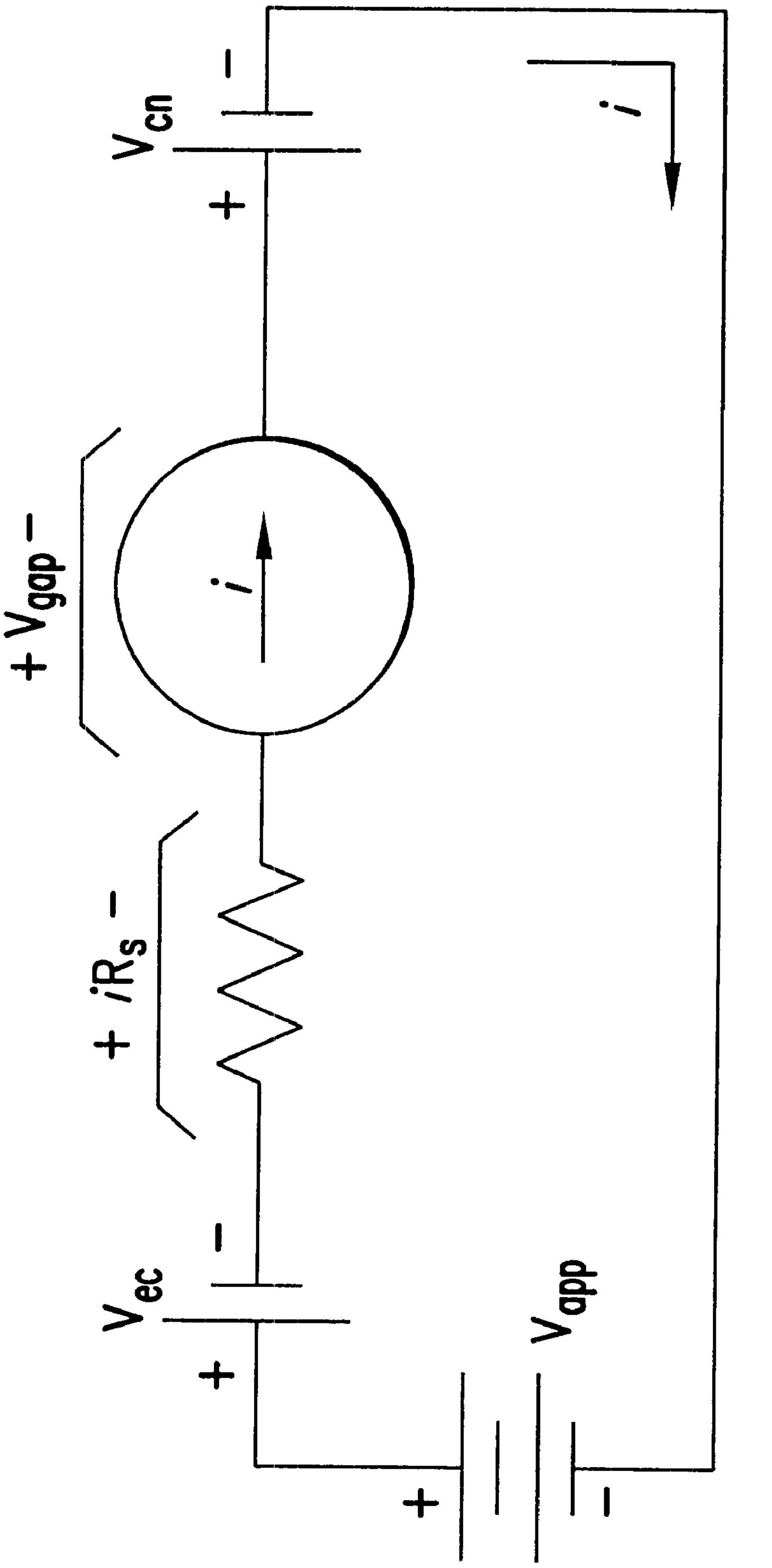
FIG. 4 is the complete equivalent circuit for electrospray ionization in the case of positive ion generation.

The complete equivalent circuit is shown in FIG. 4 for the case of positive ion generation. It includes all the components discussed above. The constant current regulator of the electrostatic spray process determines the current i in the circuit. The electrochemical contact and charge neutralization processes are voltages ($V_{ec}$ and $V_{cn}$) that oppose the applied voltage, $V_{app}$. The solution resistance, $R_s$, will result in an iR drop also opposing $V_{app}$. It will only be significant in the case of non-conducting needles. The voltage across the gap, $V_{gap}$, is then:

$$V_{gap}=V_{app}-V_{ec}-iR_s-V_{cn} \quad \text{(Eq. 1)}$$

In the case of a conducting needle, $iR_s$, $V_{ec}$ and $V_{cn}$ are all small compared to $V_{app}$. In this situation, the approximation that $V_{gap}=V_{app}$is valid. Thus, all the current-voltage behavior that has been observed with metal or metal-coated needles has been that of the charge separation process itself. Normal electrospray ionization conditions have a current that is on the order of $10^{-7}$ A and a $V_{app}$ that usually ranges from 2–8 kV. Thus, if $iR_s$, is to be large enough for it to be a significant fraction of $V_{app}$ (1 kV or greater), then $R_s$, has to be at least $10^{10}$ Ω or larger. In the case of a non-conducting needle, the solution resistance can have a significant effect since $R_s$, can be $10^{10}$ Ω or larger as we will show in the Results and Discussion section. Also, when $iR_s$ is a significant fraction of $V_{app}$, Eq. 1 becomes:

$$V_{gap}=V_{app}-iR_s \quad \text{(Eq. 2)}$$

EXAMPLE

The electrospray ionization needle assembly includes a World Precision Instruments (Sarasota, Fla.) TAURUS-R-X-Y-Z type micromanipulator which holds an in-house mount for the electrospray ionization needle of choice. The sample is introduced into the electrospray ionization needle through a 100 μm glass capillary transfer line that is connected to an SGE (Austin, Tex.) 250 μl type gas tight syringe using a Harvard Apparatus (South Natick, Mass.) Model 22 type syringe pump. The high voltage power supply is connected directly to the needle. For the non-conducting glass capillary experiments, a 25 or 50 μm i.d. glass capillary is used as the needle. The electrical contact is made through the stainless steel union between the fused silica capillary transfer line and the glass needle. In some experiments (non-conducting glass capillary needle and conventional electrospray ionization configurations) a $5\times10^{10}$ Ω Victoreen (Cleveland, Ohio) resistor was placed between the high voltage power supply and the connection to the needle. Unless otherwise noted, the flowrate (Γ) for the 24 and 50 μm glass capillary spray needles is 1 μl/min and the flowrate for the stainless steel needle (≈250 μm i.d.) is 8 μl/min. The flowrate was measured under all of the experimental conditions and the amount of sample consumed always coincided with the requested flowrate. Furthermore, the whole assembly was analyzed for leaks and none were found. Also, the distance between the spray needle and the metal plate is 1 mm for the glass spray needles and 3.5 mm for the metal spray needles. Unless otherwise noted, the needle length for all the non-conducting glass capillary glass spray needles was 5 cm. The current was measured with an ammeter that was connected between the spray needle and the power supply.

Stock solutions of NaCl and tetrapentylammonium bromide (TPABr) were prepared in methanol. Appropriate dilutions were then made from the stock. Conductance measurements were performed with a Barnstead (Boston, Mass.) Model PM-70CB type conductivity bridge and a YSI (Yellow Springs, Ohio) 3400 type dip cell.

In the experiments discussed, we used a non-conducting needle in various configurations to observe the effect of $iR_s$, under conditions where it could be significant.

In the first instance, it was desirable to change the solution resistance without changing the solution composition. This is to avoid the effect that a change in composition might have on the charge separation process. The solution resistance is related to the resistivity of the solution and the needle geometry by equation 3.

$$R_2=\rho\frac{L}{A}=\frac{1}{\kappa}\frac{L}{\pi r^2}=\frac{1.27}{\kappa}\frac{L}{d^2} \quad \text{(Eq. 3)}$$

where ρ is the resistivity of the solution, κ is the solution conductivity, L is the length of the glass capillary comprising the needle, A is its inner cross-sectional area, r is the inner radius, and d is the inner diameter. A conductivity meter was used to measure the value of κ for each of the solutions used. From this measurement and the length and diameter of capillary used, the expected value for $R_s$ could be calculated. These values, in terms of $R_s$ per cm. Of capillary length, are shown in Table 1 for several solutions and several capillary diameters.

TABLE 1

| [TPABr] in methanol with $2\times10^{-5}$M NaCl | 25 μm Ω $cm^{-1}$ | 50 μm Ω $cm^{-1}$ | 250 μm Ω $cm^{-1}$ |
|---|---|---|---|
| 0M | $4.06\times10^{10}$ | $1.02\times10^{10}$ | $4.06\times10^{8}$ |
| $5\times10^{-6}$M | $3.65\times10^{10}$ | $9.14\times10^{9}$ | $3.65\times10^{8}$ |
| $5\times10^{-5}$M | $2.88\times10^{10}$ | $7.20\times10^{9}$ | $2.88\times10^{8}$ |
| $5\times10^{-4}$M | $4.77\times10^{9}$ | $1.19\times10^{9}$ | $4.77\times10^{7}$ |

Figure 5:
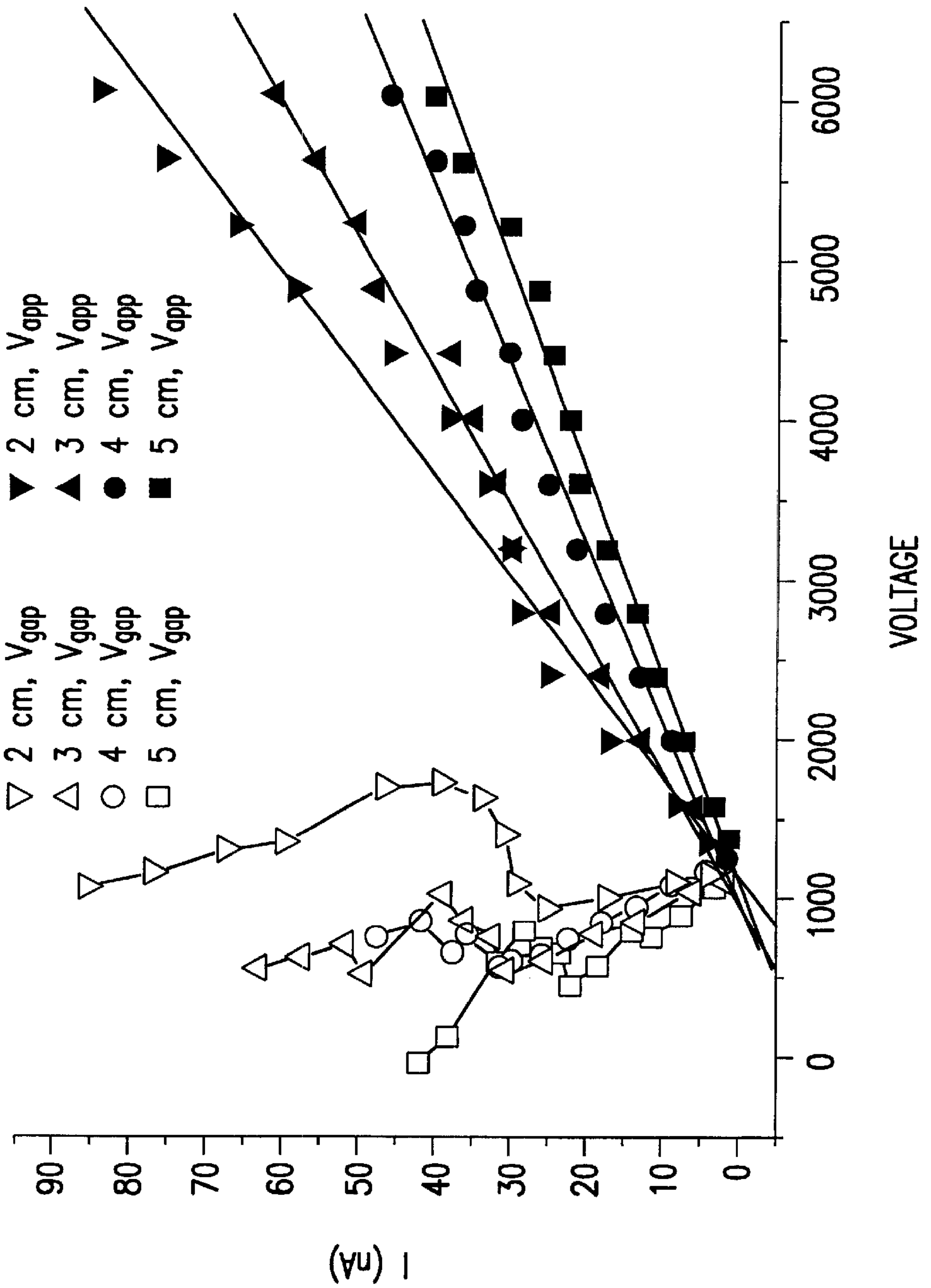
FIG. 5 shows the effect of glass needle length in graph form by the current vs. $V_{gap}$ and $V_{app}$ is shown for 2, 3, 4 and 5 cm lengths of 25 μm non-conducting glass capillary needle. The solution used was $5\times10^{-5}$ M $TPA^+$ and $2\times10^{-5}$ M $Na^+$ in methanol.

One of factors affecting $R_s$ in equation (3) is the length of the glass capillary needle. As the needle length decreases, $R_s$ should decrease and the slope of the current-voltage curve (dI/dV) should increase. The dark data points in FIG. 5 shows this effect. The solution used was $5\times10^{-5}$ M $TPA^+$ and $2\times10^{-5}$ M $Na^+$ in methanol. The non-conducting glass capillary needle was 25 μm in diameter. From the resistances in Table 1, we expect $R_s$ to be $1.44\times10^{11}$ Ω for the 5 cm needle, $1.15\times10^{11}$ Ω for the 4 cm needle, $8.64\times10^{10}$ Ω for the 3 cm needle, and $5.76\times10^{10}$ Ω for the 2 cm needle. These values were used with equation 2 to calculate $V_{gap}$ in FIG. 5. The plot of current vs. $V_{gap}$ essentially yields the current-voltage curve for the constant current regulator generated by the needle tip, gap, and counter electrode. Unlike the case with the conducting needle where $V_{gap}=V_{app}$, $V_{gap}$ is relatively constant for the non-conducting glass capillary needle. Thus, i (which is a measure of the rate of excess charge production) for a given set of conditions is allowed to increase, while $V_{gap}$ remains essentially the same.

Furthermore, it is possible to calculate an equivalent resistance from the slope of the $V_{app}$ versus i curves in FIG. 5 using equation (4).

$$\frac{1}{R} = \frac{di}{dV} = \text{slope} \qquad \text{(Eq. 4)}$$

From these slopes, the measured resistance per unit length ranges from $2.5\times10^{10}$ Ω/cm to $3.0\times10^{10}$ Ω/cm. These values are very close to the value of $2.88\times10^{10}$ Ω/cm that is calculated from conductance measurements and the dimensions of the glass capillary spray needle. Therefore, the slope of the current-voltage ($V_{app}$) curve is entirely from the resistance of the solution.

Finally, to confirm that similar behavior does not occur in the conducting needle, various lengths were used and the current-voltage curve was examined. The curves for the 6.8 and 3.0 cm lengths of metal needle were virtually identical.

Figure 6:
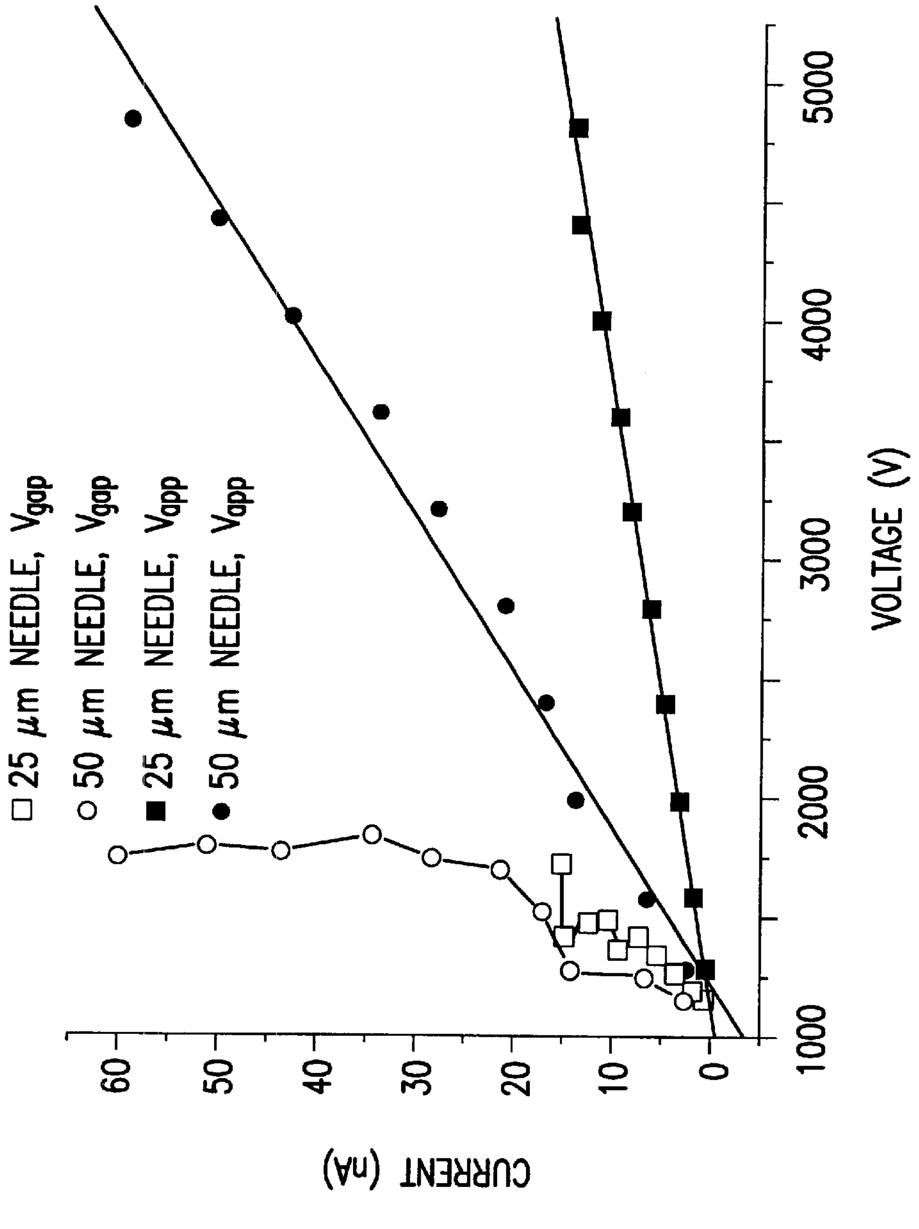
FIG. 6 shows the effect of glass needle inner diameter in graph form by the current vs. $V_{gap}$ and $V_{app}$ is shown for 25 μm and 50 μm inner diameter glass capillary spray needles. The solution used was $2\times10^{-5}$ M NaCl in methanol.

Another factor that affects $R_s$ according to equation (3) is the inner diameter of the glass capillary needle. From equation (3), the resistance of the solution goes down as the inner diameter of the needle increases. In fact, for the 25 and 50 μm glass spray needles, the value of $R_s$ calculated from the current-voltage curve is always approximately 4 times larger in the 25 μm needle (for the same length and same solution) than one would expect from equation (3). This is shown in FIG. 6. The solution used for this experiment was $2\times10^{-5}$ M NaCl in methanol. Thus, from Table 1, the calculated solution resistances for the 25 and 50 μm needles (bother were 5 cm long) are $2.03\times10^{11}$ Ω and $5.1\times10^{10}$ Ω. As before, these resistances calculated from the measured solution conductivity and the actual dimensions of the glass capillary were used to calculate $V_{gap}$. Again, $V_{gap}$ is relatively constant under both sets of conditions. Finally, the $R_s$ values calculated from the slope (see Eq. 4) of the experimentally generated current-voltage curves ($2.31\times10^{11}$ Ω and $6.23\times10^{10}$ Ω) are once again in close agreement with those calculated using the conductivity measurements and the dimensions of the glass capillary spray needle.

The effect of solution conductivity has already been carefully characterized in the case of the metal spray needle. In general, the current, i, should be proportional to the conductivity of the solution, $K^n$, where n has been determined to be a value in the range of 0.22 to 0.57.

Figure 7:
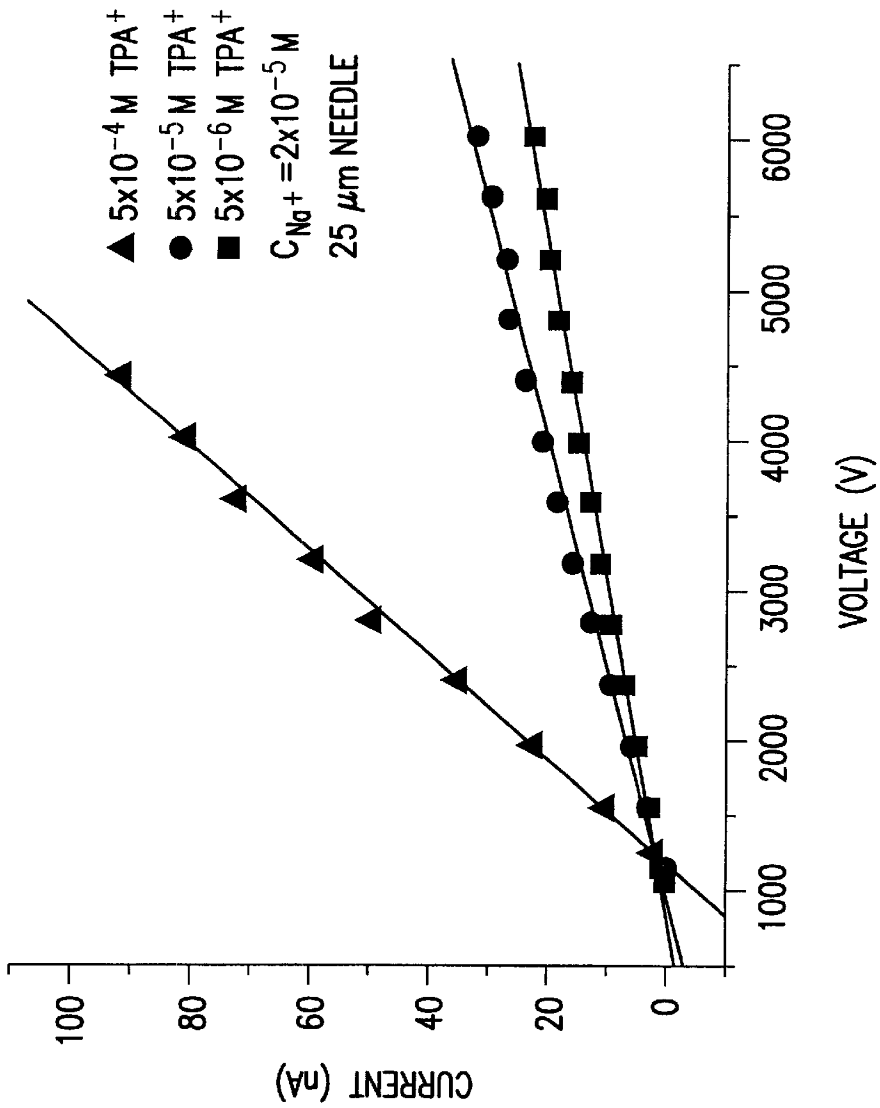
FIG. 7 shows the effect of solution conductivity on the current-voltage curve with the non-conducting glass spray needle in graph form.

Based on the observations made above, a much more straightforward relationship is expected with the glass capillary spray needle. The slope of the current-voltage curve is determined by $R_s$ when $R_s$ is of appropriate magnitude. Thus, the slope of the current-voltage curve should change proportionally with the measured conductivity. FIG. 7 shows that the measured slope of the current-voltage curve does increase with solution conductivity. The solutions in Table 1 were used with a 5 cm long, 25 μm glass spray needle. The following are ratios of the slopes for the current voltage curves in FIG. 7 using the values from the conductivity meter in Table 1:

$$\frac{5\times10^{-5}MTPA^{+}}{5\times10^{-6}MTPA^{+}} = 1.45 \text{ and } \frac{5\times10^{-4}MTPA^{+}}{5\times10^{-5}MTPA^{+}} = 5.88$$

(all samples contain $2\times10^{-5}$ M NaCl). The ratios from the plots of the current-voltage curves are 1.27 and 4.28 respectively. The differences in these ratios could be from errors with the conductivity meter, temperature differences in the lab on the day the two experiments were conducted, or from dilution errors (since the measurements were conducted with two different sets of dilutions). However, the ratios measured from the electrospray ionization generated current-voltage curve and from the conductivity meter are in close agreement. From this we see that with small-bore glass capillary needles, the current-voltage curve is dominated by the $iR_s$ drop in the solution.

Figure 8:
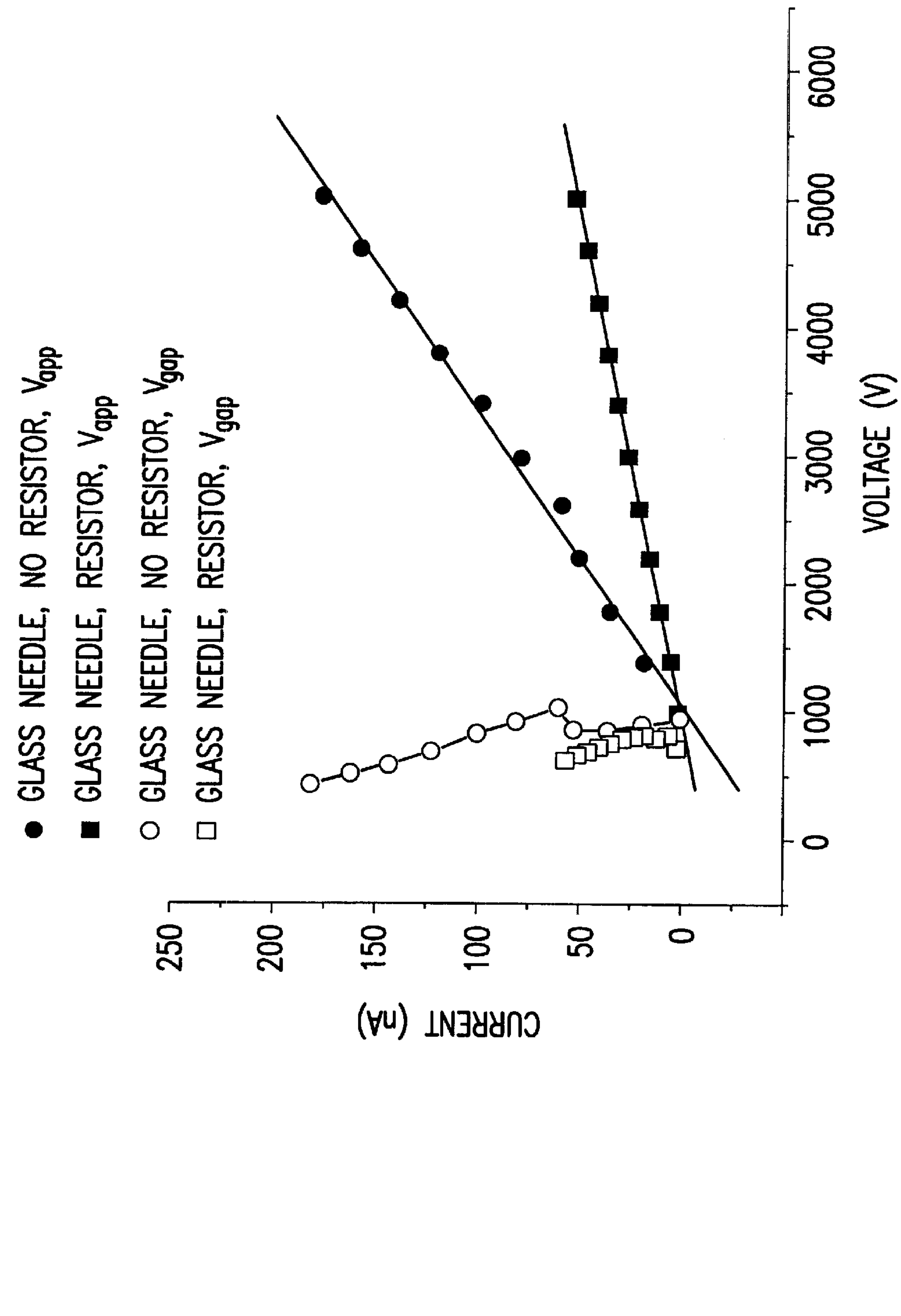
FIG. 8 shows the effect of adding a large resistor ($5\times10^{10}\Omega$) in series with the glass spray needle in graph form.

A separate resistor is put in series with the glass needle and power supply. The resulting slope is consistent with the sum of the inserted resistance and that ascribed to the solution resistance. The results of this experiment for a methanol solution that contained $5\times10^{-4}$ M $TPA^+$ and $2\times10^{-5}$ M $Na^+$ in a 5 cm long, 25 μm needle with and without a $5\times10^{10}$ Ω resistor in series are shown in FIG. 8. The expected $R_s$ without the resistor as calculated from the values in Table 1 is $2.50\times10^{10}$ Ω. When the $5\times10^{10}$ Ω resistor is in series with the glass needle, the expected resistance is $7.50\times10^{10}$ Ω. When used these values to calculate $V_{gap}$. In both instances, $V_{gap}$ changes by about 400 V whilst $V_{app}$ changes by 5 kV. Furthermore, the calculated total resistance from the slope of both current-voltage curves is in very close agreement with the expected values. Without the resistor, the $R_s$ obtained from the slope of the curve is $2.21\times10^{10}$ Ω and with the resistor, the overall resistance from the slope of the curve is $7.20\times10^{10}$ Ω.

Figure 9A:
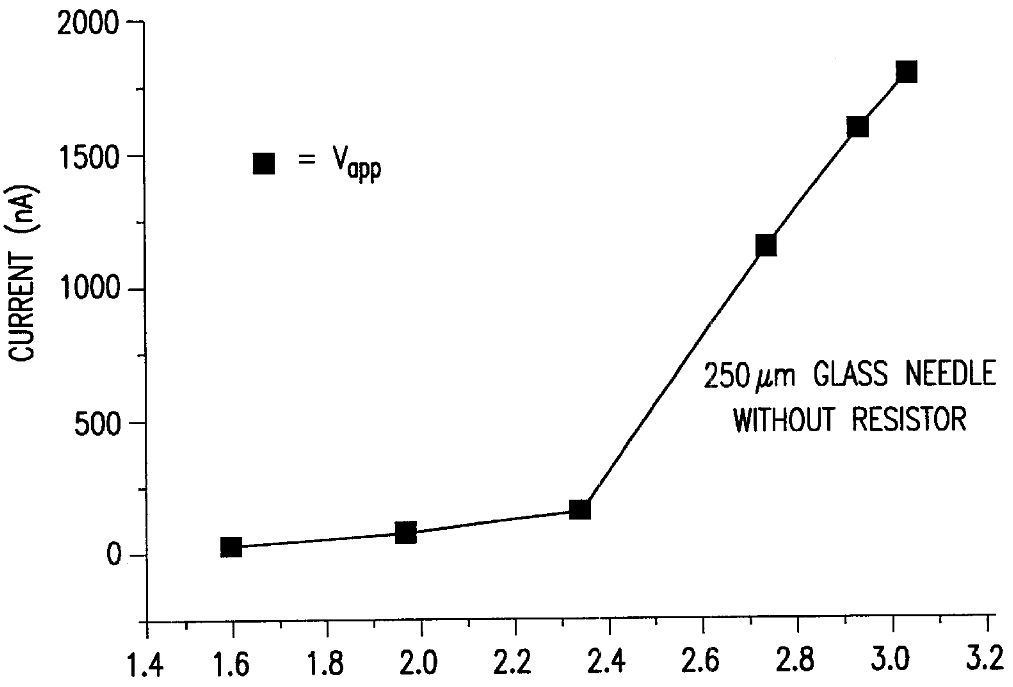
FIG. 9(*a*) and 9(*b*) show the current-voltage curves for a) the 250 μm glass spray needle with no resistor and b) the current vs. $V_{app}$ and $V_{gap}$ for the 250 μm glass spray needle with a $5\times10^{10}$ Ω resistor in series with the power supply.
Figure 9B:
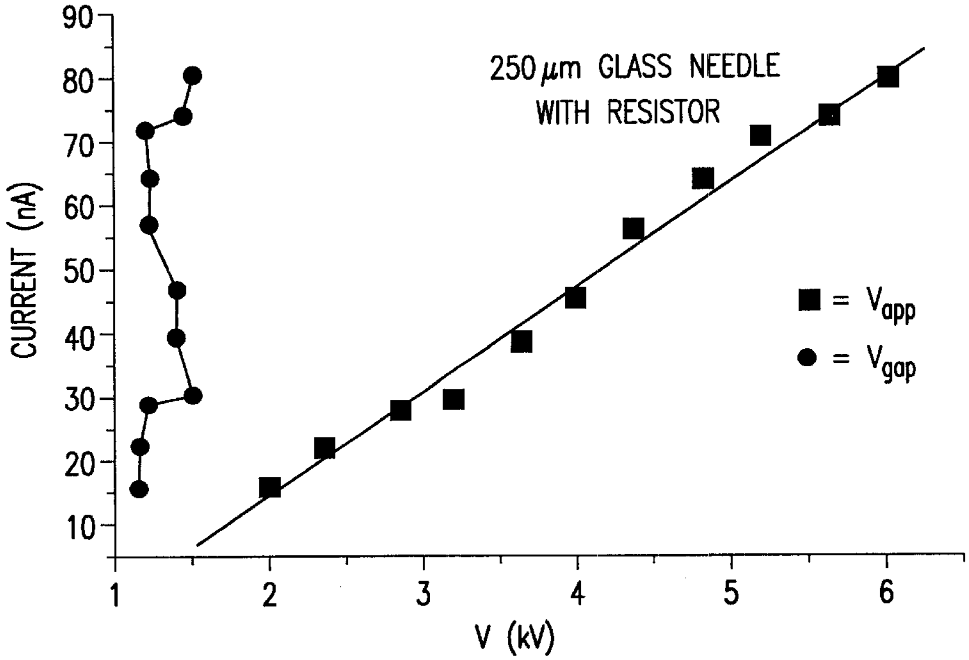

A resistor for electrospray ionization should be on the order of $10^{10}$ Ω or larger to have a significant impact on the electrospray ionization circuit. The resistor can also be a varistor, a stepped ladder or an active I-V control device, if desired. However, in the case of the 250 μm glass capillary needle, the $R_s$ is too small. This is shown in FIG. 9*a* for a methanol solution that contains $5\times10^{-6}$ M $TPA^+$ and $2\times10^{-5}$ M $Na^+$ in a 250 μm glass needle with a length of 5 cm. The large diameter of the glass capillary results in a value for $R_s$, considerably less than $10^{10}$ Ω. If we use the values in Table 1, the calculated $R_s$ for this configuration is $1.83\times10^{9}$ Ω. The resulting current-voltage curve now more resembles that of the metal needle. However, when the $5\times10^{10}$ Ω resistor is put in series with the 250 μm glass spray needle, the total resistance is large enough to dictate the shape of the current-voltage curve (see FIG. 9*b*). When $V_{gap}$ is calculated using the $5\times10^{10}$ Ω resistor, it remains essentially constant while the measured current for the electrospray ionization process changes by almost an order of magnitude. Here the current-voltage curve of the small-bore glass capillary (nearly constant $V_{gap}$) has been achieved by adding a series resistor.

From previous observations and interpretations, it follows that a resistor placed in series with the metal spray needle should cause it to behave more like the glass spray needle. The $5\times10^{10}$ Ω resistor was placed in series with a metal spray needle. The current-voltage curves for $5\times10^{-6}$ M $TPA^+$ (tetrapentylammonium ion) in a methanol solution. Note the increased operating range of the metal spray needle. At a distance of only 2.5 mm from the metal plate, no arcing occurs and no deviation from a stable Taylor cone is observed for a wide range of applied voltage (up to 6 kV) . Furthermore, with the resistor in series with the metal spray needle, $V_{gap}$ remains relatively independent of $V_{app}$ and i.

Also, the calculated resistance from the experimentally generated current-voltage curve is $5.2 \times 10^{10}\ \Omega$, well within the 10% tolerance of the resistor. The similar opening characteristics of the non-conducting glass spray needle and the metal needle with the resistor lend justification to the claim that the unique behavioral characteristics of the non-conducting glass capillary are due to the resistance of the solution.

The current-voltage curve for the metal needle without resistor compared to the current-voltage curve for the metal needle with the resistor when the plotted voltage is $V_{gap}$. shows the current-voltage curve for the constant current regulator generated by the spray needle tip, gap, and counter electrode with and without the large resistor. In the case without the resistor, the current does increase with $V_{app}$ (without the resistor, $V_{app}=V_{gap}$), since the increase in field strength increases the rate of charge separation. Above 3.4 kV, a precipitous rise in current occurs with the onset of arcing. As already mentioned, this is analogous to the breakdown of the medium between the electrodes in a current limited device. The gap voltage remains relatively constant when the large resistor is placed in series with the electrospray ionization power supply. Therefore, the current-voltage curves for these two cases look very different. Thus, it would appear that yet again, the electrospray ionization process behaves very differently when an iR drop exists that is a significant fraction of $V_{app}$.

The dramatic effect of a significant iR drop on the current-voltage curve for the charge separation process in electrospray ionization has been conclusively demonstrated.

The solution resistances used to generate $V_{gap}$were calculated from conductivity measurements and glass capillary dimensions. This unequivocably proves that the solution resistance was indeed the primary contributor to the resulting current-voltage curve.

What is claimed is:

1. A process to stabilize performance of electrospray ionization comprising the step of placing a resistor in series with an electrospray gap, apart from resistive properties of an ionization needle, thereby achieving resistive stabilization of the electrospray ionization, wherein the resistor has a resistance of at least $10^{10}\ \Omega$.

2. The process to stabilize performance of electrospray ionization as claimed in claim 1, wherein the needle is a narrow bore glass needle, a wide-bore glass needle, a metal-coated glass needle, a drawn-tip glass needle, or a metal needle.

3. The process to stabilize performance of electrospray ionization as claimed in claim 1, wherein the resistive stabilization is achieved by placing the resistor in an electrospay ionization power supply.

4. The process to stabilize performance of electrospray ionization as claimed in claim 1, wherein the resistive stabilization is achieved by a constant current source with a large load.

5. The process to stabilize performance of electrospray ionization as claimed in claim 1, wherein the resistor is a varistor, a stepped ladder or an active I-V control device.

6. An electrospray ionization apparatus to stabilize performance of electrospray ionization comprising a resistor in series with an electrospray gap, apart from resistive properties of an electrospray ionization needle, thereby achieving resistive stabilization of the electrospray ionization, wherein the resistor has a resistance of at least $10^{10}\ \Omega$.

7. The electrospray ionization apparatus as claimed in claim 6, wherein the needle is a narrow bore glass needle, a wide-bore glass needle, a metal-coated glass needle, a drawn-tip glass needle, or a metal needle.

8. The electrospray ionization apparatus as claimed in claim 6, wherein the resistive stabilization is achieved by placing the resistor in an electrospay ionization power supply.

9. The electrospray ionization apparatus as claimed in claim 6, wherein the resistive stabilization is achieved by a constant current source with a large load.

10. The electrospray ionization apparatus as claimed in claim 6, wherein the resistor is a varistor, a stepped ladder or an active I-V control device.

* * * * *